US012648085B2

(12) United States Patent
Saita

(10) Patent No.: US 12,648,085 B2
(45) Date of Patent: Jun. 2, 2026

(54) CIRCUIT BOARD

(71) Applicant: TDK Corporation, Tokyo (JP)

(72) Inventor: Hitoshi Saita, Tokyo (JP)

(73) Assignee: TDK Corporation, Tokyo (JP)

( * ) Notice: Subject to any disclaimer, the term of this patent is extended or adjusted under 35 U.S.C. 154(b) by 310 days.

(21) Appl. No.: 18/259,163

(22) PCT Filed: Jan. 12, 2022

(86) PCT No.: PCT/JP2022/000631
§ 371 (c)(1),
(2) Date: Jun. 23, 2023

(87) PCT Pub. No.: WO2022/158340
PCT Pub. Date: Jul. 28, 2022

(65) Prior Publication Data
US 2024/0057258 A1 Feb. 15, 2024

Related U.S. Application Data

(60) Provisional application No. 63/139,039, filed on Jan. 19, 2021.

(51) Int. Cl.
H05K 1/02 (2006.01)
H05K 1/03 (2006.01)
(Continued)

(52) U.S. Cl.
CPC ........... H05K 1/181 (2013.01); H05K 1/0204 (2013.01); H05K 1/0306 (2013.01); H05K 1/111 (2013.01);
(Continued)

(58) Field of Classification Search
CPC .... H05K 1/181; H05K 1/0204; H05K 1/0306; H05K 2201/10015; H05K 2201/066;
(Continued)

(56) References Cited

U.S. PATENT DOCUMENTS 6,205,031 B1    3/2001  Herzog et al.
8,324,509 B2 *  12/2012  Ohtsuka ................. H10D 1/692
174/250
(Continued)

FOREIGN PATENT DOCUMENTS

JP        10-199755 A     7/1998
JP        2001-507522 A   6/2001
(Continued)

OTHER PUBLICATIONS

International Search Report issued in corresponding International Patent Application No. PCT/JP2022/000631, dated Mar. 15, 2022, with English translation.

(Continued)

*Primary Examiner* — Ishwarbhai B Patel
(74) *Attorney, Agent, or Firm* — Rimon P.C.

(57) ABSTRACT

An object of the present disclosure is to provide a circuit board capable of achieving improved heat dissipation characteristics. The circuit board includes a substrate having a ceramic board as a base material; and a thin film capacitor mounted on the substrate such that a mounting surface faces the conductor layer. The thin film capacitor includes the dielectric layer, first and second capacitor electrodes, formed on one and the other surfaces of the dielectric layer. The capacitor electrode is connected to the wiring pattern included in the conductor layer. The capacitor electrode or a terminal electrode connected thereto is exposed to the upper surface of the thin film capacitor that faces away from the mounting surface.

9 Claims, 15 Drawing Sheets

(51) Int. Cl.
*H05K 1/11* (2006.01)
*H05K 1/18* (2026.01)
*H05K 1/181* (2026.01)
*H05K 1/16* (2006.01)

(52) U.S. Cl.
CPC .............. *H05K 1/112* (2013.01); *H05K 1/162* (2013.01); *H05K 2201/066* (2013.01); *H05K 2201/10015* (2013.01)

(58) Field of Classification Search
CPC ...... H05K 1/0209; H01G 4/228; H01G 4/252; H01G 4/40; H01G 2/06; H01G 4/33
See application file for complete search history.

(56) References Cited

U.S. PATENT DOCUMENTS

2002/0011352 A1   1/2002  Yoshisato et al.

2007/0209201 A1 *  9/2007  Koutsaroff ............. H05K 1/162
                                                        29/830
2016/0027579 A1 *  1/2016  Kurachi ................. H01G 4/224
                                                        361/321.1
2018/0226391 A1 *  8/2018  Ueki ......................... H10D 1/20
2018/0226935 A1 *  8/2018  Yazaki ..................... H03H 1/00
2019/0348496 A1   11/2019  Murase et al.

FOREIGN PATENT DOCUMENTS

| | | |
|---|---|---|
| JP | 2009-010114 A | 1/2009 |
| JP | WO 2019026641 A1 * | 2/2019 |
| WO | 2018/174191 A1 | 9/2018 |

OTHER PUBLICATIONS

Extended European Search Report issued in the corresponding European Patent Application No. 22742462.9 on Jul. 29, 2025.

* cited by examiner

CIRCUIT BOARD

CROSS REFERENCE TO RELATED APPLICATIONS

This application is the U.S. National Phase under 35 U.S.C. § 371 of International Application No. PCT/JP2022/000631, filed on Jan. 12, 2022, which claims the benefit of U.S. Provisional Application No. 63/139,039, filed on Jan. 19, 2021, the entire contents of each are hereby incorporated by reference.

TECHNICAL FIELD

The present invention relates to a circuit board and, more particularly, to a circuit board having a configuration in which a thin film capacitor is mounted on a substrate having a ceramic board as a base material.

BACKGROUND ART

Patent Document 1 discloses a circuit board having a structure in which a chip capacitor is mounted on a DBC (Direct Bonded Copper) substrate. The DBC substrate uses a ceramic board as a base material and thus has much higher heat dissipation characteristics than typical printed circuit boards using a resin material.

CITATION LIST

Patent Document

[Patent Document 1] JP-2001-507522

DISCLOSURE OF THE INVENTION

Problem to be Solved by the Invention

However, the circuit board described in Patent Document 1 uses a typical chip capacitor, and thus sufficient heat dissipation characteristics of heat generated by the chip capacitor cannot be achieved.

It is therefore an object of the present invention to provide a circuit board capable of achieving improved heat dissipation characteristics.

Means for Solving the Problem

A circuit board according to the present invention includes: a substrate including a ceramic board, a first conductor layer formed on one surface of the ceramic board, and a second conductor layer formed on the other surface of the ceramic board; and a thin film capacitor mounted on the substrate such that a mounting surface thereof faces the first conductor layer. The first conductor layer includes a first wiring pattern. The thin film capacitor includes a dielectric layer, a first capacitor electrode formed on one surface of the dielectric layer, and a second capacitor electrode formed on the other surface of the dielectric layer. The first capacitor electrode is connected to the first wiring pattern, and the second capacitor electrode or a terminal electrode connected thereto is exposed to the upper surface of the thin film capacitor that faces away from the mounting surface.

According to the present invention, the thin film capacitor is mounted on the substrate having the ceramic board as a base material, and the second capacitor electrode of the thin film capacitor or the terminal electrode connected thereto is exposed to the upper surface of the thin film capacitor, thus allowing high heat dissipation characteristics to be obtained.

In the present invention, the exposed area of the second capacitor electrode or terminal electrode may be larger than the area of the first capacitor electrode. This further enhances heat dissipation characteristics through the second capacitor electrode or terminal electrode.

In the present invention, the first conductor layer may further include a second wiring pattern, and the second capacitor electrode may be connected to the second wiring pattern. This allows the thin film capacitor to be surface-mounted on the substrate.

In the present invention, the first conductor layer may further include a second wiring pattern, the thin film capacitor may further include a third capacitor electrode formed on one surface of the dielectric layer, and the third capacitor electrode may be connected to the second wiring pattern. This achieves a configuration in which two capacitors are connected in series to each other, so that voltage applied to the dielectric layer is dispersed.

The circuit board according to the present invention may further include a semiconductor device mounted on one surface of the substrate, and the second capacitor electrode of the thin film capacitor or the terminal electrode and the semiconductor device may be connected to each other through a bonding wire. This allows the semiconductor device and the thin film capacitor to be directly connected. In this case, the semiconductor device and the thin film capacitor may be connected through a plurality of bonding wires. This increases connection reliability.

Advantageous Effects of the Invention

As described above, according to the present invention, there can be provided a circuit board capable of achieving improved heat dissipation characteristics.

MODE FOR CARRYING OUT THE INVENTION

Hereinafter, preferred embodiments of the present invention will be described in detail with reference to the accompanying drawings.

First Embodiment

Figure 1:
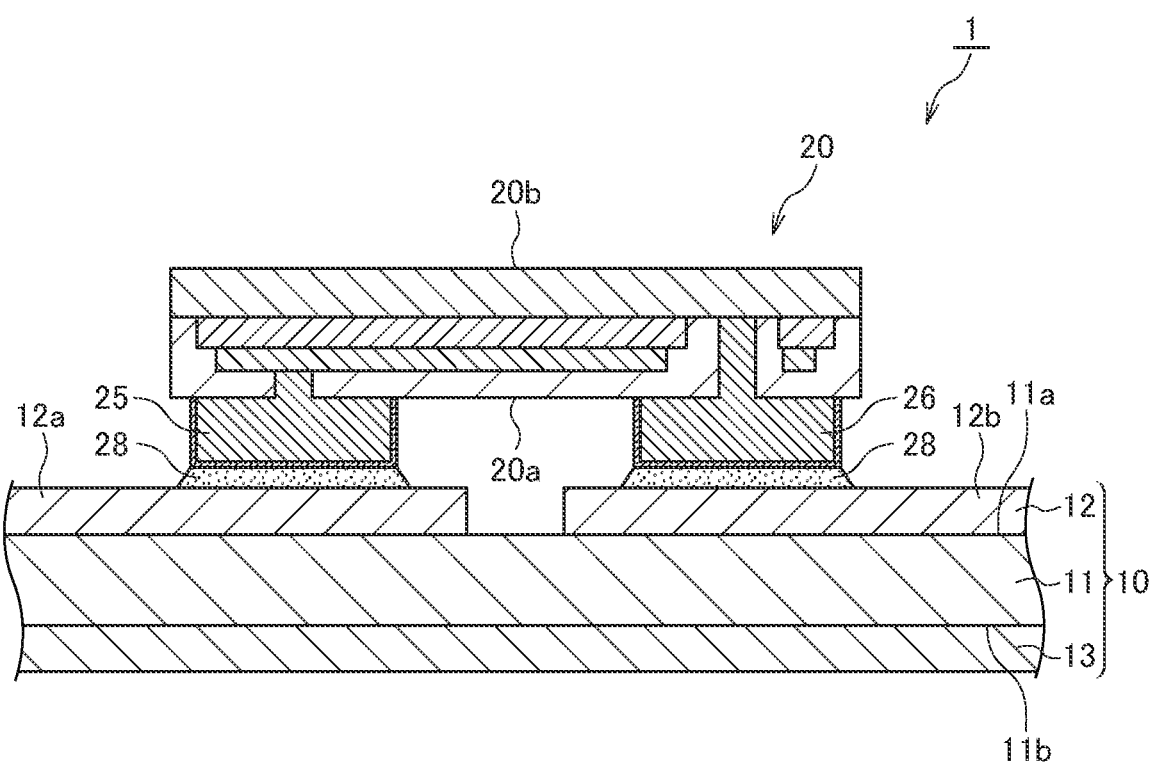
FIG. 1 is a schematic cross-sectional view for explaining the configuration of a circuit board 1 according to a first embodiment of the present invention.

FIG. 1 is a schematic cross-sectional view for explaining the configuration of a circuit board 1 according to a first embodiment of the present invention.

As illustrated in FIG. 1, the circuit board 1 according to the first embodiment includes a substrate 10 and a thin film capacitor 20 mounted on the substrate 10. The substrate 10 includes a ceramic board 11 as a base material, a conductor layer 12 formed on one surface 11a of the ceramic board 11, and a conductor layer 13 formed on the other surface 11b of the ceramic board 11. As a material of the ceramic board 11, a metal oxide or a metal nitride such as $Al_2O_3$, AlN, or $Si_3N_4$ can be used. As a material of the conductor layers 12 and 13, a good conductor such as Cu or Al can be used. When Cu is used as a material of the conductor layers 12 and 13, the substrate 10 constitutes a DBC (Direct Bonded Copper) substrate, while when Al is used, the substrate 10 constitutes a DBA (Direct Bonded Aluminum) substrate.

Figure 2:
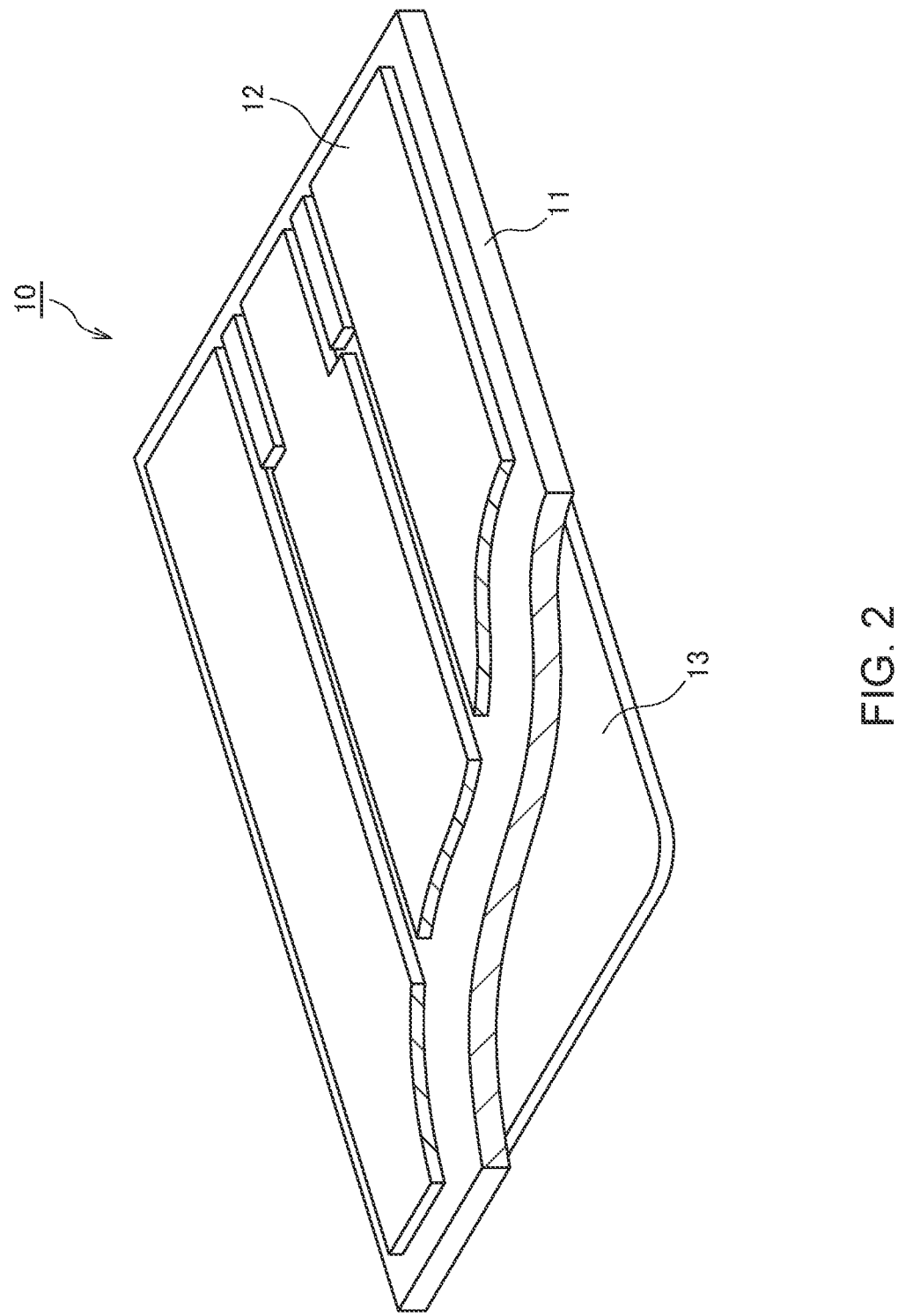
FIG. 2 is a schematic perspective view for explaining the structure of the substrate 10.

FIG. 2 is a schematic perspective view for explaining the structure of the substrate 10. As illustrated in FIG. 2, the conductor layer 12 has a plurality of wiring patterns, while the conductor layer 13 is a solid pattern. The conductor layer 13 is fixed to a not-shown metal heat sink or the like. As illustrated in FIG. 1, the conductor layer 12 includes wiring patterns 12a and 12b.

Figure 3:
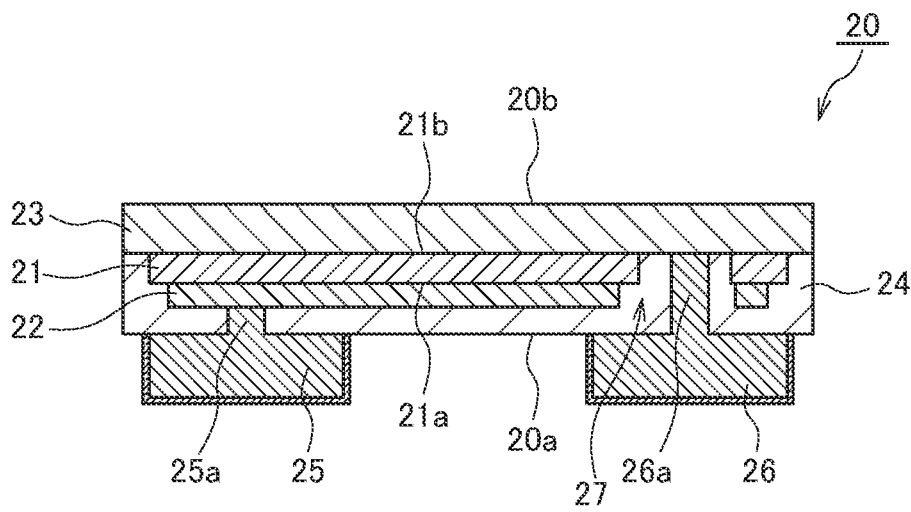
FIG. 3 is a schematic cross-sectional view for explaining the configuration of the thin film capacitor 20.

FIG. 3 is a schematic cross-sectional view for explaining the configuration of the thin film capacitor 20.

As illustrated in FIG. 3, the thin film capacitor 20 includes a dielectric layer 21, a capacitor electrode 22 formed on one surface 21a of the dielectric layer 21, a capacitor electrode 23 formed on the other surface 21b of the dielectric layer 21, and a passivation layer 24 provided so as to embed therein the dielectric layer 21 and capacitor electrode 22. The capacitor electrodes 22 and 23 overlap each other with the dielectric layer 21 interposed therebetween, whereby a predetermined capacitance can be obtained.

The dielectric layer 21 is formed using, for example, a perovskite dielectric material. Examples of the perovskite dielectric material include: a ferroelectric or paraelectric material having a perovskite structure such as $BaTiO_3$ (barium titanate), $(Ba_{1-x}Sr_x)TiO_3$ (barium strontium titanate), $(Ba_{1-x}Ca_x)TiO_3$, $PbTiO_3$, $Pb(Zr_xTi_{1-x})O_3$, $(Sr_{1-x}Ca_x)(Ti_{1-y}Zr_y)O_3$, or $Ba(Mg_{1/3}Ta_{2/3})O_3$; a complex perovskite relaxer ferroelectric material such as $Pb(Mg_{1/3}Nb_{2/3})O_3$; a bismuth layered compound such as $Bi_4Ti_3O_{12}$ or $SrBi_2Ta_2O_9$; and a tungsten bronze ferroelectric material such as $(Sr_{1-x}Ba_x)Nb_2O_6$ or $PbNb_2O_6$. Meanwhile, a ratio of A site and B site in the perovskite structure, perovskite relaxer ferroelectric material, bismuth layered compound, and tungsten bronze ferroelectric material is typically an integral ratio; however, it is allowable to intentionally depart the ratio from the integral ratio to improve characteristics. An additive can be appropriately added to the dielectric layer 21 as an accessory component to control the characteristics of the dielectric layer 21. The relative permittivity ($\varepsilon_r$) of the dielectric layer 21 is, for example, equal to or more than 10. The relative permittivity of the dielectric layer 21 is preferably as large as possible, and the upper limit value thereof is not particularly limited. Further, the withstand voltage of the dielectric layer 21 is also as large as possible, and the upper limit value thereof is not particularly limited. The thickness of the dielectric layer 21 is, e.g., about 10 nm to 6000 nm.

The capacitor electrodes 22 and 23 are each a metal foil made of high melting point metal such as nickel (Ni). The capacitor electrode 23 functions also as a support for ensuring mechanical strength of the thin film capacitor 20. The surface of the capacitor electrode 23 facing away from the surface thereof in contact with the dielectric layer 21 constitutes an upper surface 20b of the thin film capacitor 20. In the manufacturing process of the thin film capacitor 20, the dielectric layer 21 and capacitor electrode 22 are stacked in this order on the surface of the capacitor electrode 23 serving as a support. Thus, the area of the dielectric layer 21 is smaller than the area of the capacitor electrode 23, and the area of the capacitor electrode 22 is smaller than the area of the dielectric layer 21. The surface of the passivation layer 24 constitutes a mounting surface 20a of the thin film capacitor 20. The passivation layer 24 is made of, for example, resin.

Figure 4:
FIG. 4 is an equivalent circuit diagram of the thin film capacitor 20.

There are provided terminal electrodes 25 and 26 on the mounting surface 20a of the thin film capacitor 20. The terminal electrode 25 is connected to the thin film capacitor 20 through a via conductor 25a penetrating the passivation layer 24. The dielectric layer 21 and capacitor electrode 22 have an opening 27. The terminal electrode 26 is connected to the capacitor electrode 23 through a via conductor 26a penetrating the passivation layer 24 so as to pass the opening 27. Thus, as illustrated in FIG. 4, a configuration in which one capacitor is connected between the terminal electrodes 25 and 26 is obtained. As a material of the terminal electrodes 25, 26 and via conductors 25a, 26a, a good conductor such as Cu can be used. The surfaces of each of the terminal electrodes 25 and 26 may be covered with a surface treated layer such as an ENEPIG film.

The thus configured thin film capacitor 20 is mounted on the substrate 10 such that the mounting surface 20a faces the conductor layer 12, as illustrated in FIG. 1. Thus, the terminal electrode 25 of the thin film capacitor is connected to the wiring pattern 12a, and the terminal electrode 26 of the thin film capacitor 20 is connected to the wiring pattern 12b. The connection of the terminal electrodes 25 and 26 to the respective wiring patterns 12a and 12b is made through a solder 28.

With the above configuration, heat generated due to driving of the thin film capacitor 20 under high voltage is not only dissipated to the substrate 10 side through the terminal electrodes 25 and 26 but also dissipated from the upper surface 20b which is the exposed surface of the capacitor electrode 23. In addition, the back and side surfaces of the capacitor electrode 23 are entirely exposed, and the exposed area of the capacitor electrode 23 is larger than the area of the capacitor electrode 22, thus significantly enhancing heat dissipation characteristics through the capacitor electrode 23. Thus, it is possible to achieve higher heat dissipation characteristics than those when a chip capacitor such as MLCC (Multilayered Ceramic Capacitors) is used in place of the thin film capacitor 20.

Second Embodiment

Figure 5:
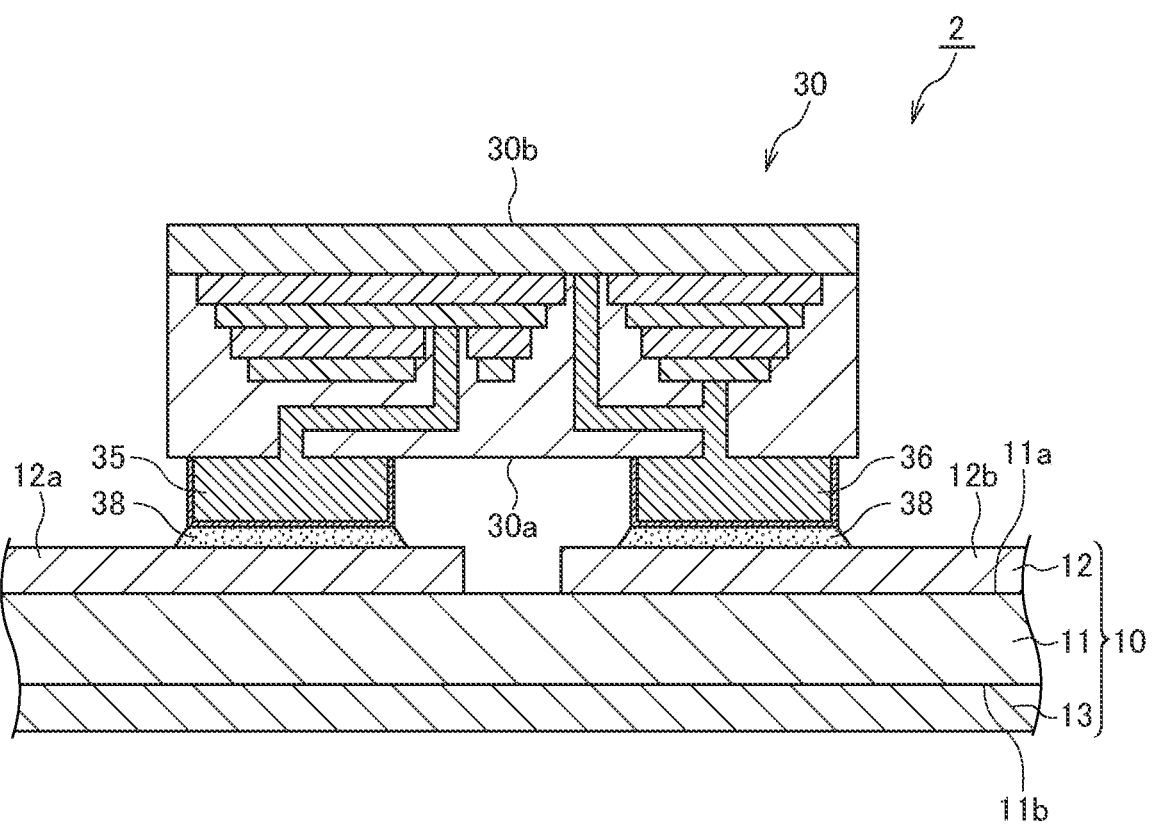
FIG. 5 is a schematic cross-sectional view for explaining the configuration of a circuit board 2 according to a second embodiment of the present invention.

FIG. 5 is a schematic cross-sectional view for explaining the configuration of a circuit board 2 according to a second embodiment of the present invention.

As illustrated in FIG. 5, the circuit board 2 according to the second embodiment differs from the circuit board 1 according to the first embodiment in that a thin film capacitor 30 is mounted on the substrate 10 in place of the thin film capacitor 20. Other basic configurations are the same as those of the circuit board 1 according to the first embodiment, so the same reference numerals are given to the same elements, and overlapping description will be omitted.

Figure 6:
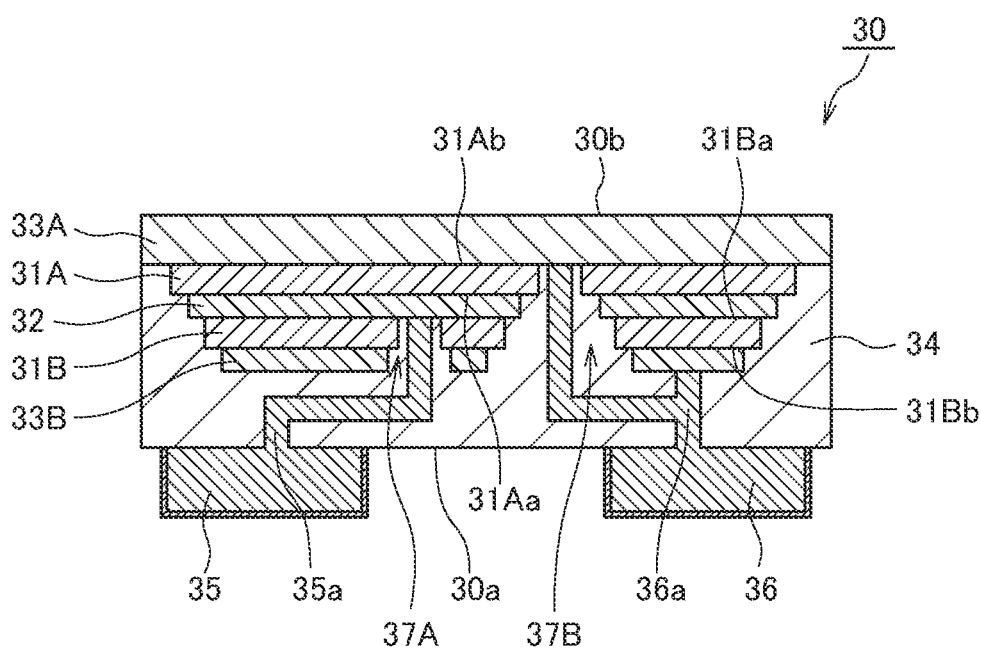
FIG. 6 is a schematic cross-sectional view for explaining the configuration of the thin film capacitor 30.

FIG. 6 is a schematic cross-sectional view for explaining the configuration of the thin film capacitor 30.

As illustrated in FIG. 6, the thin film capacitor 30 includes dielectric layers 31A, 31B, a capacitor electrode 32 positioned between one surface 31Aa of the dielectric layer 31A and one surface 31Ba of the dielectric layer 31B, a capacitor electrode 33A formed on the other surface 31Ab of the dielectric layer 31A, a capacitor electrode 33B formed on the other surface 31Bb of the dielectric layer 31B, and a passivation layer 34 provided so as to embed therein the dielectric layers 31A, 31B and capacitor electrodes 32, 33B. The capacitor electrodes 32, 33A, and 33B overlap one another with the dielectric layers 31A and 31B interposed therebetween, whereby a predetermined capacitance can be obtained. The material of the dielectric layers 31A and 31B may be the same as that of the above-described dielectric layer 21. The material of the capacitor electrodes 32, 33A, and 33B may be the same as that of the above-described capacitor electrodes 22 and 23.

The capacitor electrode 33A functions also as a support for ensuring mechanical strength of the thin film capacitor 20. The surface of the capacitor electrode 33A facing away from the surface thereof in contact with the dielectric layer 31A constitutes an upper surface 30b of the thin film capacitor 30. In the manufacturing process of the thin film capacitor 30, the dielectric layer 31A, capacitor electrode 32, dielectric layer 31B, and capacitor electrode 33B are stacked in this order on the surface of the capacitor electrode 33A serving as a support. Thus, the area of the dielectric layer 31A is smaller than the area of the capacitor electrode 33A, the area of the capacitor electrode 32 is smaller than the area of the dielectric layer 31A, the area of the dielectric layer 31B is smaller than the area of the capacitor electrode 32, and the area of the capacitor electrode 33B is smaller than the area of the dielectric layer 31B. The surface of the passivation layer 34 constitutes a mounting surface 30a of the thin film capacitor 30.

Figure 7:
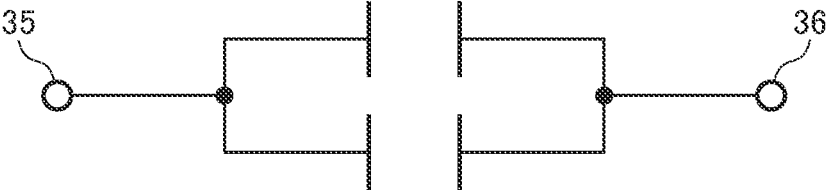
FIG. 7 is an equivalent circuit diagram of the thin film capacitor 30.

The dielectric layer 31B and capacitor electrode 33B have an opening 37A. Further, the dielectric layer 31A, capacitor electrode 32, dielectric layer 31B, and capacitor electrode 33B have an opening 37B. There are provided terminal electrodes 35 and 36 on the mounting surface 30a of the thin film capacitor 30. The terminal electrode 35 is connected to the capacitor electrode 32 through a via conductor 35a penetrating the passivation layer 34 so as to pass the opening 37A. Further, the terminal electrode 36 is connected to the capacitor electrodes 33A and 33B through a via conductor 36a penetrating the passivation layer 34 so as to pass the opening 37B. Thus, as illustrated in FIG. 7, a configuration in which two capacitors are connected between the terminal electrodes 35 and 36 is obtained. The surfaces of each of the terminal electrodes 35 and 36 may be covered with a surface treated layer such as an ENEPIG film.

The thus configured thin film capacitor 30 is mounted on the substrate 10 such that the mounting surface 30a faces the conductor layer 12, as illustrated in FIG. 5. Thus, the terminal electrode 35 of the thin film capacitor is connected to the wiring pattern 12a, and the terminal electrode 36 of the thin film capacitor 30 is connected to the wiring pattern 12b. The connection of the terminal electrodes 35 and 36 to the respective wiring patterns 12a and 12b is made through a solder 38.

As described above, the circuit board 2 according to the present embodiment uses the thin film capacitor 30 having a configuration in which two capacitors are connected in parallel, making it possible to obtain a capacitance larger than that obtained in the circuit board 1 according to the first embodiment. The number of capacitors to be connected in parallel is not particularly limited and may be three or more.

Third Embodiment

Figure 8:
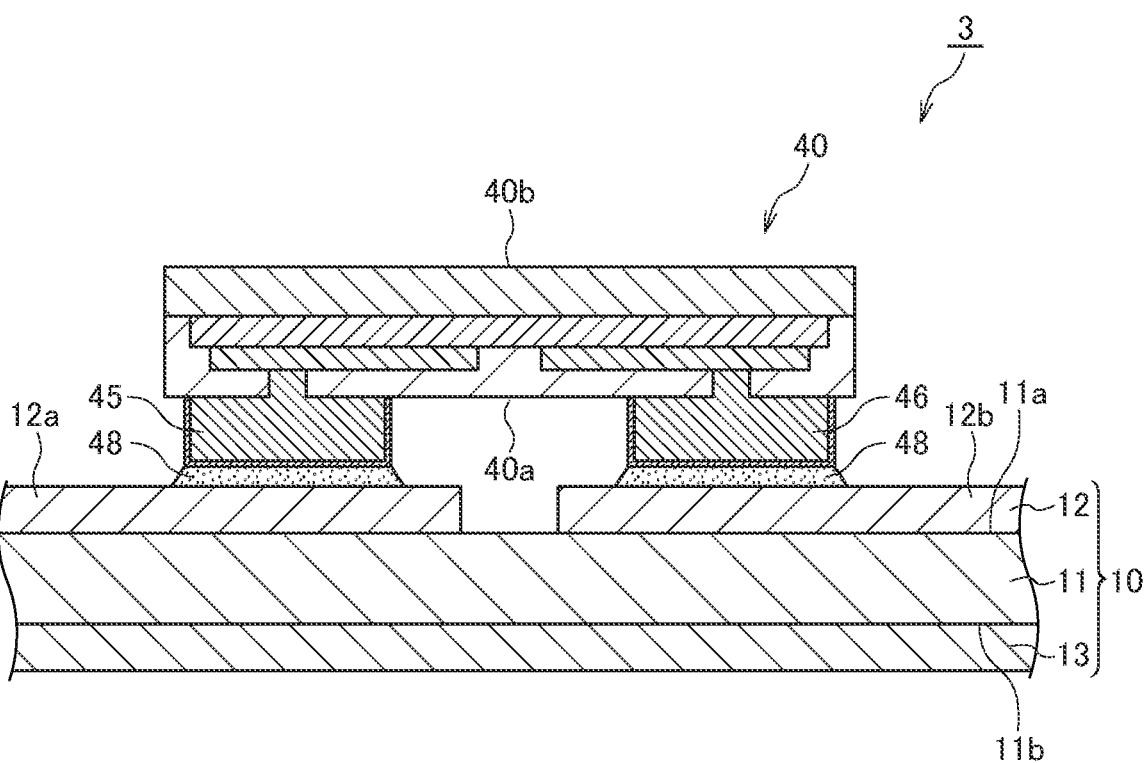
FIG. 8 is a schematic cross-sectional view for explaining the configuration of a circuit board 3 according to a third embodiment of the present invention.

FIG. 8 is a schematic cross-sectional view for explaining the configuration of a circuit board 3 according to a third embodiment of the present invention.

As illustrated in FIG. 8, the circuit board 3 according to the third embodiment differs from the circuit board 1 according to the first embodiment in that a thin film capacitor 40 is mounted, in place of the thin film capacitor 20, on the substrate 10. Other basic configurations are the same as those of the circuit board 1 according to the first embodiment, so the same reference numerals are given to the same elements, and overlapping description will be omitted.

Figure 9:
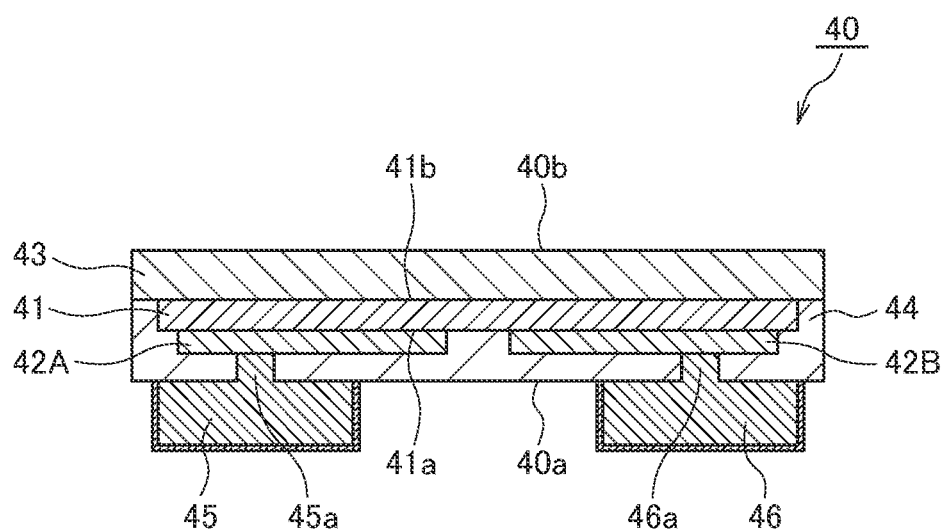
FIG. 9 is a schematic cross-sectional view for explaining the configuration of the thin film capacitor 40.

FIG. 9 is a schematic cross-sectional view for explaining the configuration of the thin film capacitor 40.

As illustrated in FIG. 9, the thin film capacitor 40 includes a dielectric layer 41, capacitor electrodes 42A and 42B formed on one surface 41a of the dielectric layer 41, a capacitor electrode 43 formed on the other surface 41b of the dielectric layer 41, and a passivation layer 44 provided so as to embed therein the dielectric layer 41 and capacitor electrodes 42A and 42B. The capacitor electrodes 42A and 42B are formed at mutually different plane positions on the one surface 41a of the dielectric layer 41 and each overlap the capacitor electrode 43 with the dielectric layer 41 interposed therebetween. The material of the dielectric layer 41 may be the same as that of the above-described dielectric layer 21. The material of the capacitor electrodes 42A, 42B, and 43 may be the same as that of the above-described capacitor electrodes 22 and 23.

The capacitor electrode 43 functions also as a support for ensuring mechanical strength of the thin film capacitor 40. The surface of the capacitor electrode 43 facing away from the surface thereof in contact with the dielectric layer 41 constitutes an upper surface 40b of the thin film capacitor 40. In the manufacturing process of the thin film capacitor 40, the dielectric layer 41, capacitor electrodes 42A and 42B are stacked in this order on the surface of the capacitor electrode 43 serving as a support. The surface of the passivation layer 44 constitutes a mounting surface 40a of the thin film capacitor 40.

Figure 10:
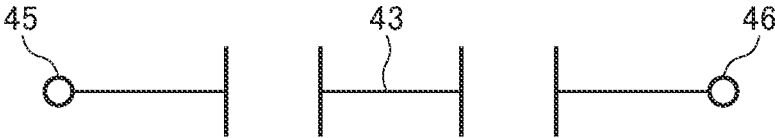
FIG. 10 is an equivalent circuit diagram of the thin film capacitor 40.

There are provided terminal electrodes 45 and 46 on the mounting surface 40*a* of the thin film capacitor 40. The terminal electrode 45 is connected to the capacitor electrode 42A through a via conductor 45*a* penetrating the passivation layer 44. Further, the terminal electrode 46 is connected to the capacitor electrode 42B through a via conductor 46*a* penetrating the passivation layer 44. Thus, as illustrated in FIG. 10, a configuration in which two capacitors are connected in series between the terminal electrodes 45 and 46 is obtained. The surfaces of each of the terminal electrodes 45 and 46 may be covered with a surface treated layer such as an ENEPIG film.

The thus configured thin film capacitor 40 is mounted on the substrate 10 such that the mounting surface 40*a* faces the conductor layer 12, as illustrated in FIG. 8. Thus, the terminal electrode 45 of the thin film capacitor is connected to the wiring pattern 12*a*, and the terminal electrode 46 of the thin film capacitor 40 is connected to the wiring pattern 12*b*. The connection of the terminal electrodes 45 and 46 to the respective wiring patterns 12*a* and 12*b* is made through a solder 48.

As described above, the circuit board 3 according to the present embodiment uses the thin film capacitor 40 having a configuration in which two capacitors are connected in series, so that voltage to be applied to the dielectric layer 41 is dispersed more than in the circuit board 1 according to the first embodiment. This achieves higher withstand voltage than in the circuit board 1 according to the first embodiment. The number of capacitors to be connected in series is not particularly limited and may be three or more.

Fourth Embodiment

Figure 11:
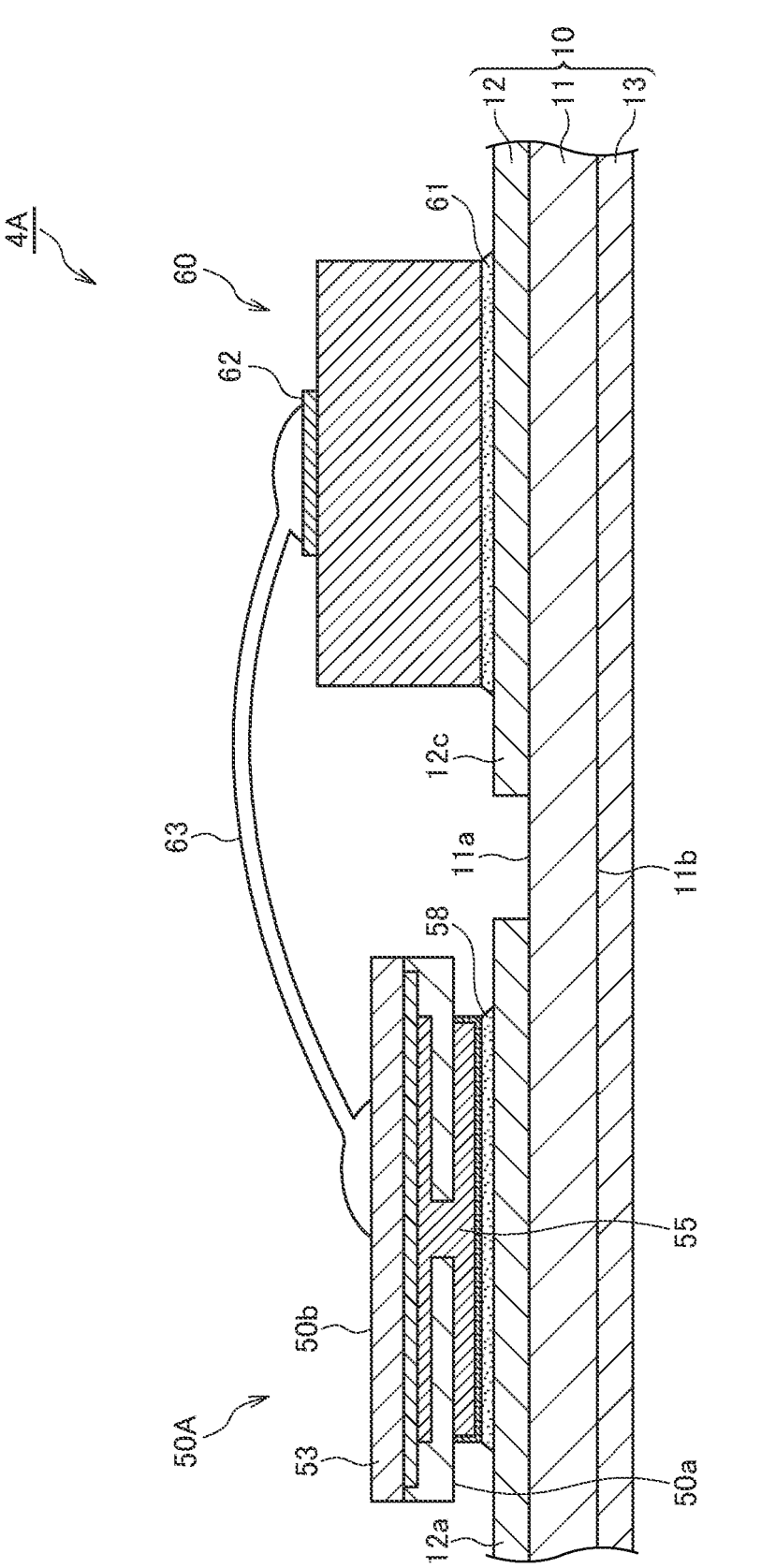
FIG. 11 is a schematic cross-sectional view for explaining the configuration of a circuit board 4A according to a fourth embodiment of the present invention.

FIG. 11 is a schematic cross-sectional view for explaining the configuration of a circuit board 4A according to a fourth embodiment of the present invention.

As illustrated in FIG. 11, the circuit board 4A according to the fourth embodiment differs from the circuit board 1 according to the first embodiment in that a thin film capacitor 50A is mounted, in place of the thin film capacitor 20, on the substrate 10 and that a semiconductor device 60 is mounted on the substrate 10. Other basic configurations are the same as those of the circuit board 1 according to the first embodiment, so the same reference numerals are given to the same elements, and overlapping description will be omitted. The conductor layer 12 of the substrate 10 includes a wiring pattern 12*c*, and the semiconductor device 60 is mounted on the wiring pattern 12*c* through a solder 61. The semiconductor device 60 is not particularly limited in type and may be a power device of a type in which current flows perpendicular to a semiconductor substrate, such as an IGBT. As a material of a semiconductor substrate used for the semiconductor device 60, SiC, GaN, or the like may be used in addition to Si.

Figure 12:
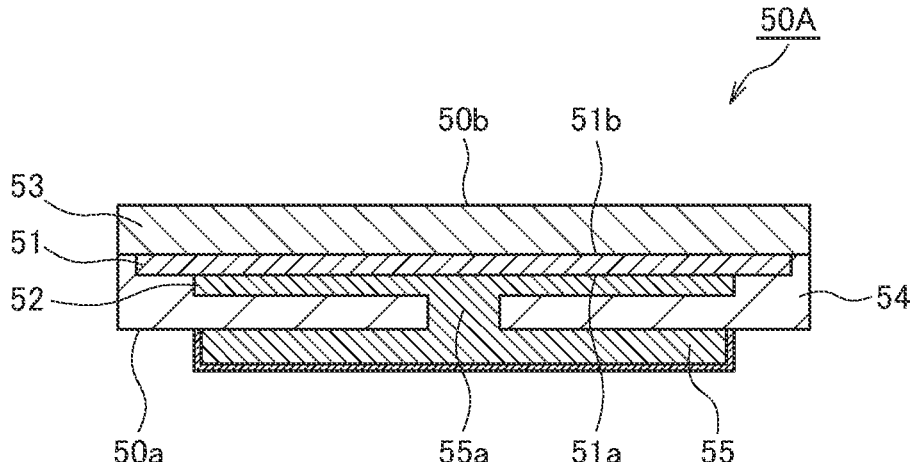
FIG. 12 is a schematic cross-sectional view for explaining the configuration of the thin film capacitor 50A.

FIG. 12 is a schematic cross-sectional view for explaining the configuration of the thin film capacitor 50A.

As illustrated in FIG. 12, the thin film capacitor 50A includes a dielectric layer 51, a capacitor electrode 52 formed on one surface 51*a* of the dielectric layer 51, a capacitor electrode 53 formed on the other surface 51*b* of the dielectric layer 51, and a passivation layer 54 provided so as to embed therein the dielectric layer 51 and capacitor electrode 52. The capacitor electrodes 52 and 53 overlap each other with the dielectric layer 51 interposed therebetween, whereby a predetermined capacitance can be obtained. The material of the capacitor electrodes 52 and 53 may be the same as that of the above-described capacitor electrodes 22 and 23. Alternatively, Cu and Ni may be used for the capacitor electrodes 52 and 53, respectively.

The capacitor electrode 53 functions also as a support for ensuring mechanical strength of the thin film capacitor 50A. The surface of the capacitor electrode 53 facing away from the surface thereof in contact with the dielectric layer 51 constitutes an upper surface 50*b* of the thin film capacitor 50A. In the manufacturing process of the thin film capacitor 50A, the dielectric layer 51 and capacitor electrode 52 are stacked in this order on the surface of the capacitor electrode 53 serving as a support. Thus, the area of the dielectric layer 51 is smaller than the area of the capacitor electrode 53, and the area of the capacitor electrode 52 is smaller than the area of the dielectric layer 51. The surface of the passivation layer 54 constitutes a mounting surface 50*a* of the thin film capacitor 50A.

There is provided a terminal electrode 55 on the mounting surface 50*a* of the thin film capacitor 50A. The terminal electrode 55 is connected to the capacitor electrode 52 through a via conductor 55*a* penetrating the passivation layer 54. Thus, a configuration in which one capacitor is connected between the terminal electrode 55 and the capacitor electrode 53 is obtained. The surfaces of the terminal electrode 55 may be covered with a surface treated layer such as an ENEPIG film.

The thus configured thin film capacitor 50A is mounted on the substrate 10 such that the mounting surface 50*a* faces the conductor layer 12, as illustrated in FIG. 11. Thus, the terminal electrode 55 of the thin film capacitor 50A is connected to the wiring pattern 12*a* through a solder 58. On the other hand, the capacitor electrode 53 constituting the upper surface 50*b* is connected to a bonding pad 62 provided on the upper surface of the semiconductor device 60 through a bonding wire 63 made of Al or the like. As a result, the thin film capacitor 50A is connected between the wiring pattern 12*a* and the semiconductor device 60.

According to the present invention, the capacitor electrode 53 constituting the upper surface 50*b* is used as a bonding pad, allowing the thin film capacitor 50A and semiconductor device 60 to be directly connected without intervention of the substrate 10. In addition, the capacitor electrode 53 has an area larger than that of the capacitor electrode 52, meaning that the upper surface 50*b* of the thin film capacitor 50A has a sufficient area, which facilitates bonding work. Further, there is no need to form an opening in the dielectric layer 51, making it possible to obtain a larger capacitance. Furthermore, only one terminal electrode 55 is provided on the mounting surface 50*a* side, so that a sufficient area can be ensured for the terminal electrode 55, which improves heat dissipation characteristics from the thin film capacitor 50A to the substrate 10 through the terminal electrode 55. In the present embodiment, the film thickness of the capacitor electrode 53 may be made larger than those of the capacitor electrodes 23, 33A, and 43 described in the first to third embodiments. This allows the capacitor electrode 53 to function as a heat sink, which improves heat dissipation characteristics and can mitigate damage to be applied to the thin film capacitor 50A at the time of wire bonding.

Figure 13:
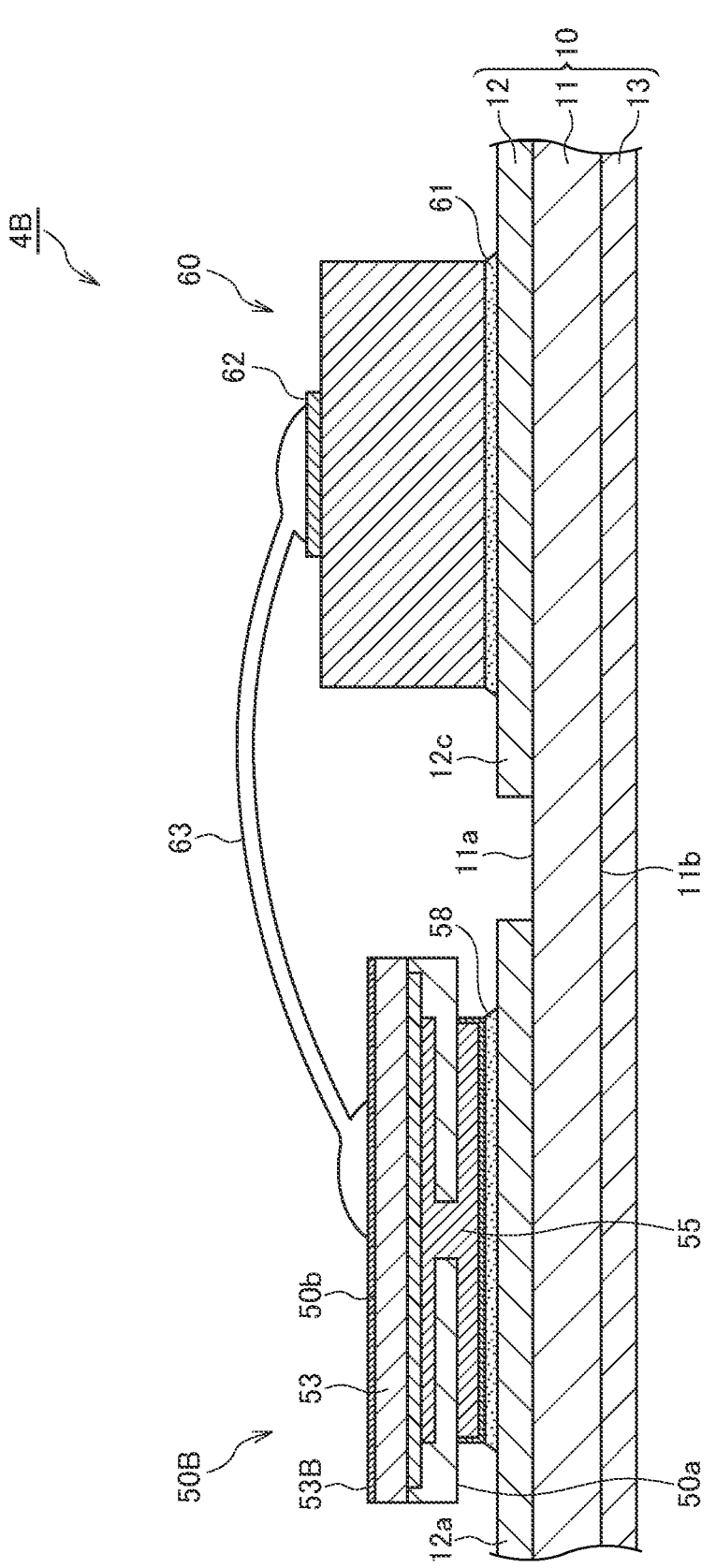
FIG. 13 is a schematic cross-sectional view for explaining the configuration of a circuit board 4B according to a modification of the fourth embodiment.

FIG. 13 is a schematic cross-sectional view for explaining the configuration of a circuit board 4B according to a modification of the fourth embodiment.

As illustrated in FIG. 13, the circuit board 4B according to the present modification differs from the circuit board 4A according to the fourth embodiment in that a thin film capacitor 50B is mounted, in place of the thin film capacitor 50A, on the substrate 10. Other basic configurations are the same as those of the circuit board 4A according to the fourth embodiment, so the same reference numerals are given to the same elements, and overlapping description will be omitted.

Figure 14:
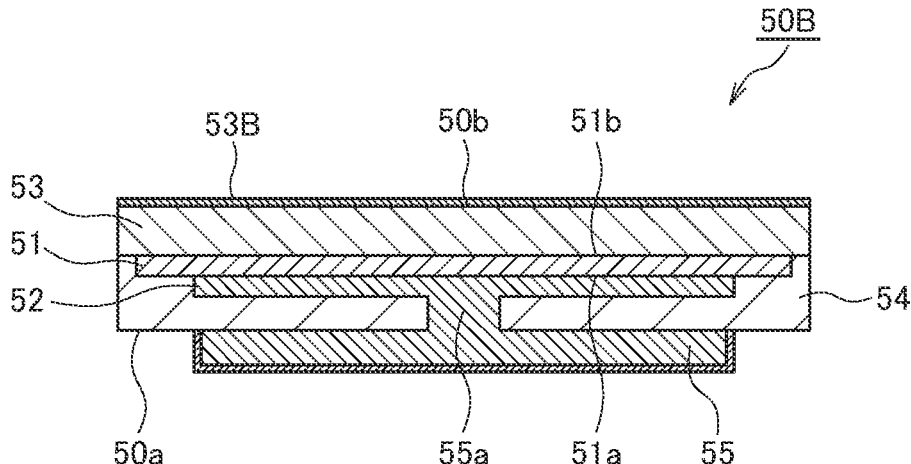
FIG. 14 is a schematic cross-sectional view for explaining the configuration of the thin film capacitor 50B.

FIG. 14 is a schematic cross-sectional view for explaining the configuration of the thin film capacitor 50B.

As illustrated in FIG. 14, the thin film capacitor 50B differs from the thin film capacitor 50A in that the surface of the capacitor electrode 53 is covered with a metal film 53B made of Sn or the like. Other basic configurations are the same as those of the thin film capacitor 50A, so the same reference numerals are given to the same elements, and overlapping description will be omitted. The metal film 53B functions to reduce surface roughness of the upper surface 50b of the thin film capacitor 50B and enhance adhesion performance of the bonding wire 63. A surface roughness Ra of the metal film 53B may be less than 100 nm. As described above, the surface of the capacitor electrode 53 may not necessarily be exposed and may be covered with the metal film 53B. Instead of covering the surface of the capacitor electrode 53 with the metal film 53B, the surface of the capacitor electrode 53 may be subjected to polishing so as to reduce the surface roughness of the upper surface 50b.

Fifth Embodiment

Figure 15:
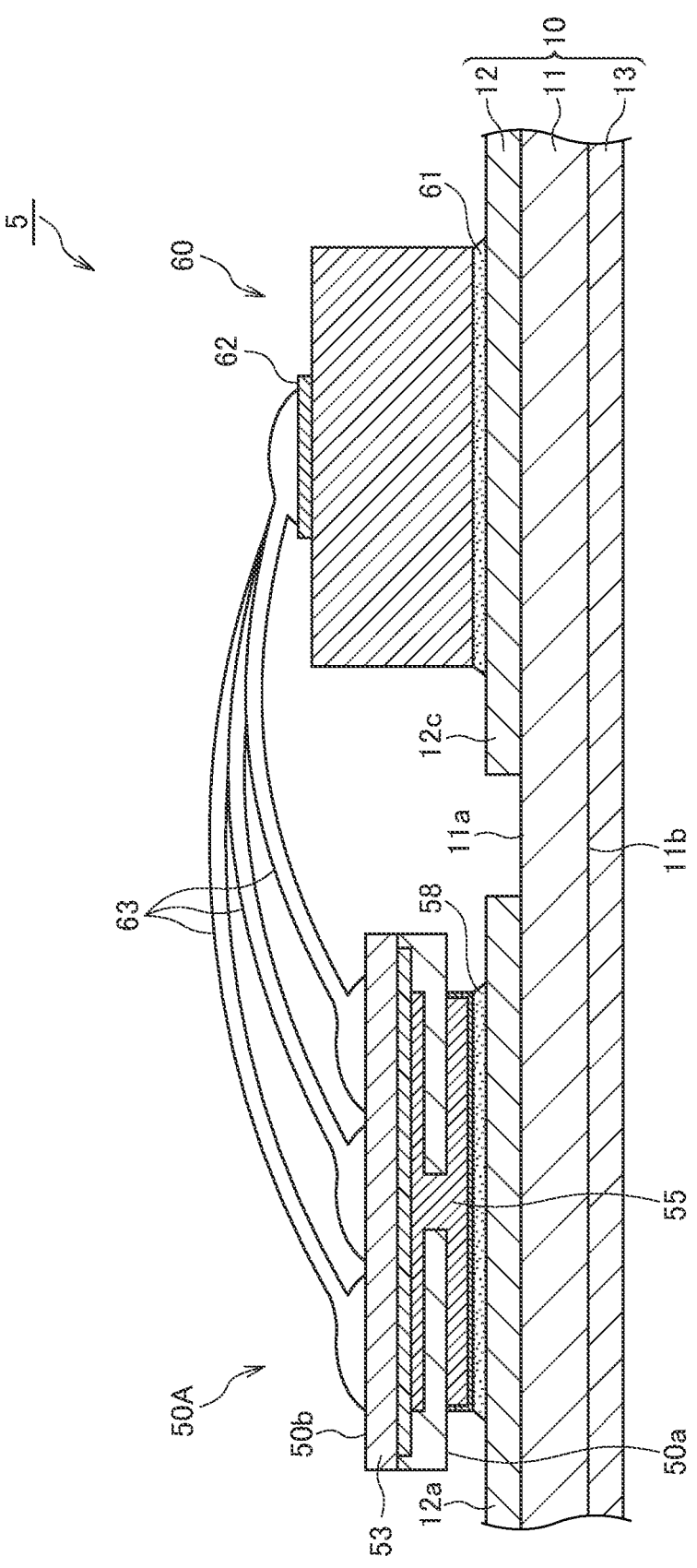
FIG. 15 is a schematic cross-sectional view for explaining the configuration of a circuit board 5 according to a fifth embodiment of the present invention.

FIG. 15 is a schematic cross-sectional view for explaining the configuration of a circuit board 5 according to a fifth embodiment of the present invention.

As illustrated in FIG. 15, the circuit board 5 according to the fifth embodiment differs from the circuit board 4A according to the fourth embodiment in that a plurality of the bonding wires 63 are provided juxtaposed. Other basic configurations are the same as those of the circuit board 4A according to the fourth embodiment, so the same reference numerals are given to the same elements, and overlapping description will be omitted.

According to the present embodiment, the thin film capacitor 50A and the semiconductor device 60 are connected by the plurality of bonding wires 63, thus increasing connection reliability and improving heat dissipation characteristics through the bonding wire 63.

Sixth Embodiment

Figure 16:
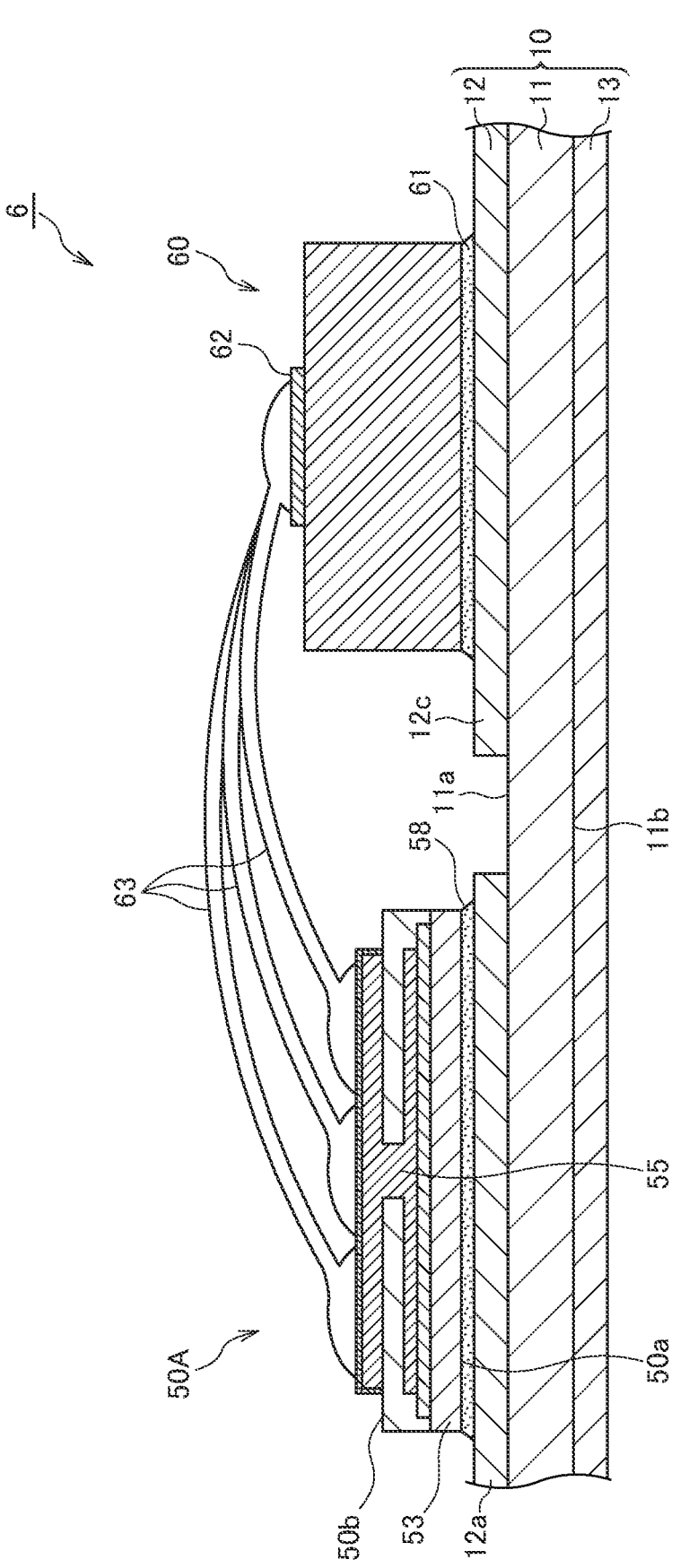
FIG. 16 is a schematic cross-sectional view for explaining the configuration of a circuit board 6 according to a sixth embodiment of the present invention.

FIG. 16 is a schematic cross-sectional view for explaining the configuration of a circuit board 6 according to a sixth embodiment of the present invention.

As illustrated in FIG. 16, the circuit board 6 according to the sixth embodiment differs from the circuit board 5 according to the fifth embodiment in that the thin film capacitor 50A is mounted upside down. Other basic configurations are the same as those of the circuit board according to the fifth embodiment, so the same reference numerals are given to the same elements, and overlapping description will be omitted.

In the present embodiment, the surface of the capacitor electrode 53 constitutes the mounting surface 50a, and the surface of the passivation layer 54 constitutes the upper surface 50b. The capacitor electrode 53 is connected to the wiring pattern 12a through the solder 58, and the terminal electrode 55 is connected to the semiconductor device 60 through the plurality of bonding wires 63. Thus, the thin film capacitor 50A may be mounted upside down on the substrate 10.

Seventh Embodiment

Figure 17:
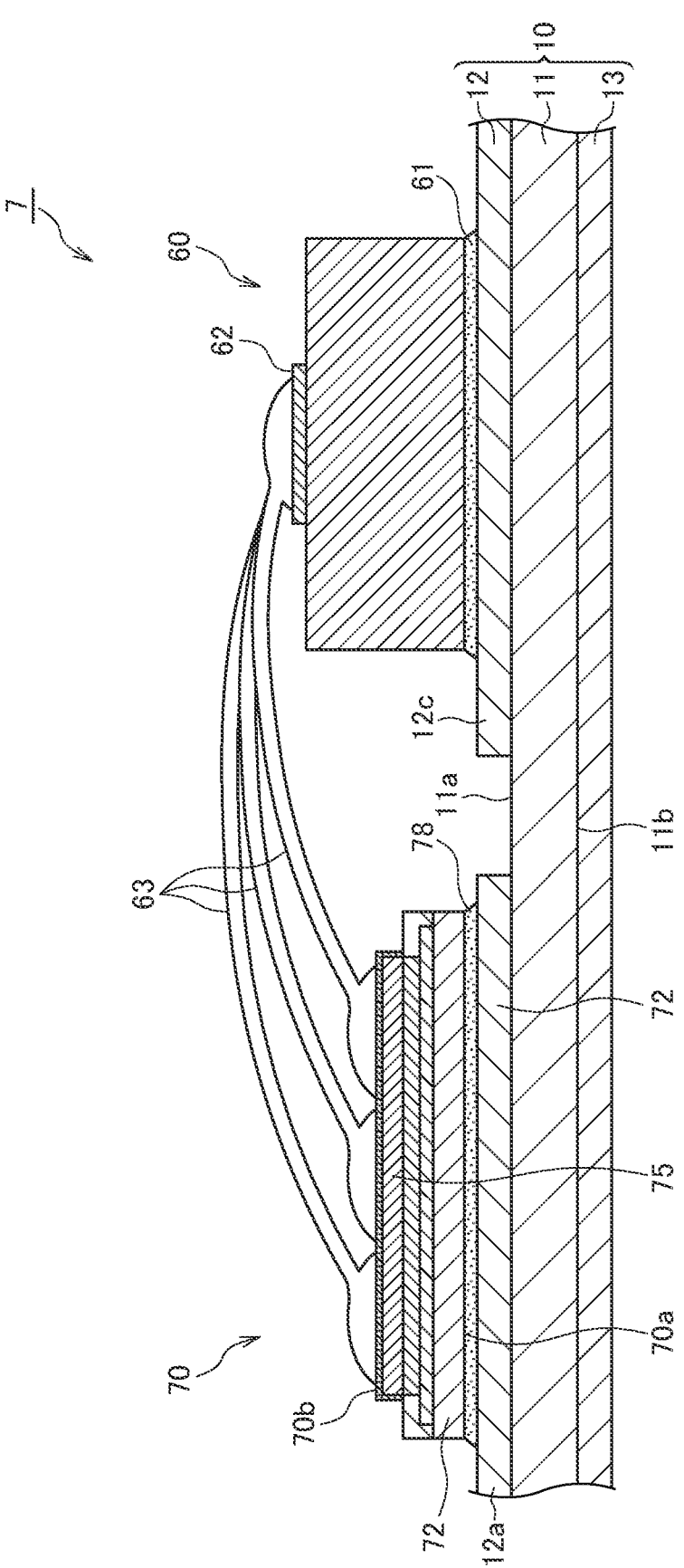
FIG. 17 is a schematic cross-sectional view for explaining the configuration of a circuit board 7 according to a seventh embodiment of the present invention.

FIG. 17 is a schematic cross-sectional view for explaining the configuration of a circuit board 7 according to a seventh embodiment of the present invention.

As illustrated in FIG. 17, the circuit board 7 according to the seventh embodiment differs from the circuit board 6 according to the sixth embodiment in that a thin film capacitor 70 is mounted, in place of the thin film capacitor 50A, on the substrate 10. Other basic configurations are the same as those of the circuit board 6 according to the sixth embodiment, so the same reference numerals are given to the same elements, and overlapping description will be omitted.

Figure 18:
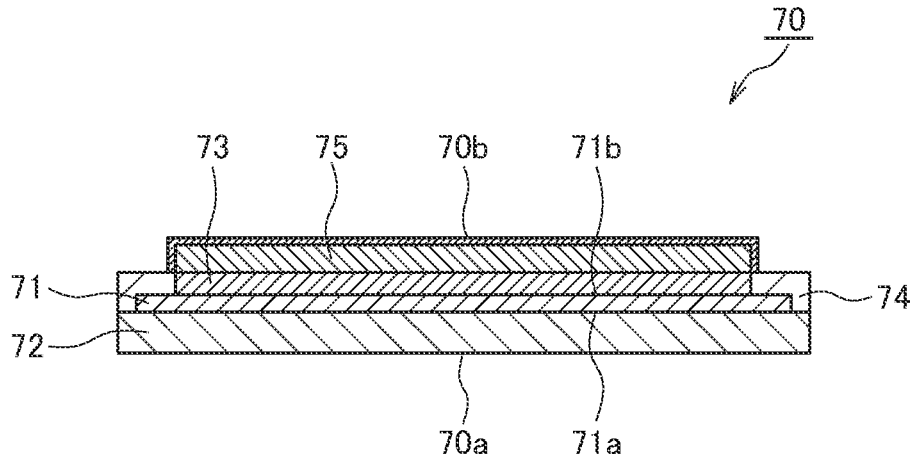
FIG. 18 is a schematic cross-sectional view for explaining the configuration of the thin film capacitor 70.

FIG. 18 is a schematic cross-sectional view for explaining the configuration of the thin film capacitor 70.

As illustrated in FIG. 18, the thin film capacitor 70 includes a dielectric layer 71, a capacitor electrode 72 formed on one surface 71a of the dielectric layer 71, a capacitor electrode 73 formed on the other surface 71b of the dielectric layer 71, a passivation layer 74 provided so as to embed therein the dielectric layer 71, and a terminal electrode 75 provided on the surface of the capacitor electrode 73 facing away from the surface thereof in contact with the dielectric layer 71. The capacitor electrodes 72 and 73 overlap each other with the dielectric layer 71 interposed therebetween, whereby a predetermined capacitance can be obtained. The material of the capacitor electrodes 72 and 73 may be the same as that of the above-described capacitor electrodes 53 and 52.

The capacitor electrode 72 functions also as a support for ensuring mechanical strength of the thin film capacitor 70. The surface of the capacitor electrode 72 facing away from the surface thereof in contact with the dielectric layer 71 constitutes a mounting surface 70a of the thin film capacitor 70. On the other hand, the surface of the terminal electrode 75 constitutes an upper surface 70b of the thin film capacitor 70. The surfaces of the terminal electrode 75 may be covered with a surface treated layer such as an ENEPIG film.

The thus configured thin film capacitor 70 is mounted on the substrate 10 such that the mounting surface 70a faces the conductor layer 12, as illustrated in FIG. 17. Thus, the capacitor electrode 72 of the thin film capacitor 70 is connected to the wiring pattern 12a through a solder 78. On the other hand, the terminal electrode 75 constituting the upper surface 70b is connected to the bonding pad 62 provided on the upper surface of the semiconductor device 60 through the plurality of bonding wires 63. As a result, the thin film capacitor 70 is connected between the wiring pattern 12a and the semiconductor device 60.

According to the present embodiment, substantially the entire surface of the capacitor electrode 73 contacts the terminal electrode 75, that is, the contact area therebetween is very large, thereby improving heat dissipation characteristics through the terminal electrode 75. In the present embodiment, substantially the entire surface of the capacitor electrode 73 contacts the terminal electrode 75, so that the terminal electrode 75 can be regarded as a part of the capacitor electrode.

While the preferred embodiment of the present invention has been described, the present invention is not limited to the above embodiment, and various modifications may be made within the scope of the present invention, and all such modifications are included in the present invention.

REFERENCE SIGNS LIST

1-3, 4A, 4B, 5-7 circuit board
10 substrate 11 ceramic board
11a, 11b surface of the ceramic board
12, 13 conductor layer
12a-12c wiring pattern
20, 30, 40, 50A, 50B, 70 thin film capacitor
20a, 30a, 40a, 50a, 70a mounting surface
20b, 30b, 40b, 50b, 70b upper surface
21, 31A, 31B, 41, 51, 71 dielectric layer
21a, 21b, 31Aa, 31Ab, 31Ba, 31Bb, 41a, 41b, 51a, 51b, 71a,
71b surface of dielectric layer
22, 23, 32, 33A, 33B, 42A, 42B, 43, 52, 53, 72, 73 capacitor electrode
24, 34, 44, 54, 74 passivation layer
25, 26, 35, 36, 45, 46, 55, 75 terminal electrode
25a, 26a, 35a, 36a, 45a, 46a, 55a via conductor
27, 37A, 37B opening
28, 38, 48, 58, 61, 78 solder
53B metal film
60 semiconductor device
62 bonding pad
63 bonding wire
What is claimed is:

1. A circuit board comprising:
a substrate including a ceramic board, a first conductor layer formed on one surface of the ceramic board, and a second conductor layer formed on other surface of the ceramic board; and
a thin film capacitor mounted on the substrate such that a mounting surface thereof faces the first conductor layer,
wherein the first conductor layer includes a first wiring pattern and a second wiring pattern,
wherein the second conductor layer includes a solid pattern overlapping the first wiring pattern, the second wiring pattern, and the thin film capacitor,
wherein the thin film capacitor includes a dielectric layer, a first capacitor electrode formed on one surface of the dielectric layer, and a second capacitor electrode formed on other surface of the dielectric layer, a first terminal electrode connected to the first capacitor electrode, and a second terminal electrode connected to the second capacitor electrode,
wherein the first terminal electrode is connected to the first wiring pattern,
wherein the second terminal electrode is connected to the second wiring pattern, and wherein the second capacitor electrode is exposed to an upper surface of the thin film capacitor that faces away from the mounting surface.

2. The circuit board as claimed in claim 1, wherein an exposed area of the second capacitor electrode is larger than an area of the first capacitor electrode.

3. The circuit board as claimed in claim 2,
wherein the first conductor layer further includes a second wiring pattern, and
wherein the second capacitor electrode is connected to the second wiring pattern.

4. The circuit board as claimed in claim 2,
wherein the first conductor layer further includes a second wiring pattern,
wherein the thin film capacitor further includes a third capacitor electrode formed on the one surface of the dielectric layer, and
wherein the third capacitor electrode is connected to the second wiring pattern.

5. The circuit board as claimed in claim 2, further comprising a semiconductor device mounted on the one surface of the substrate,
wherein the second capacitor electrode of the thin film capacitor or the terminal electrode and the semiconductor device are connected to each other through a bonding wire.

6. The circuit board as claimed in claim 1,
wherein the first conductor layer further includes a second wiring pattern,
wherein the thin film capacitor further includes a third capacitor electrode formed on the one surface of the dielectric layer, and
wherein the third capacitor electrode is connected to the second wiring pattern.

7. The circuit board as claimed in claim 1, further comprising a semiconductor device mounted on the one surface of the substrate,
wherein the second capacitor electrode of the thin film capacitor or the terminal electrode and the semiconductor device are connected to each other through a bonding wire.

8. The circuit board as claimed in claim 7, wherein a plurality of the bonding wires are provided.

9. The circuit board as claimed in claim 1, wherein the solid pattern is fixed to a metal heat sink.

* * * * *